(12) United States Patent
McLachlan

(10) Patent No.: US 10,461,048 B2
(45) Date of Patent: Oct. 29, 2019

(54) INTEGRATED CIRCUITS AND METHODS OF MANUFACTURING

(71) Applicant: LEONARDO MW LTD., Basildon, Essex (GB)

(72) Inventor: Angus David McLachlan, Basildon (GB)

(73) Assignee: LEONARDO MW LTD., Basildon, Essex (GB)

( * ) Notice: Subject to any disclaimer, the term of this patent is extended or adjusted under 35 U.S.C. 154(b) by 0 days.

(21) Appl. No.: 15/532,719

(22) PCT Filed: Dec. 16, 2015

(86) PCT No.: PCT/EP2015/080002
§ 371 (c)(1),
(2) Date: Jun. 2, 2017

(87) PCT Pub. No.: WO2016/096992
PCT Pub. Date: Jun. 23, 2016

(65) Prior Publication Data
US 2017/0352630 A1    Dec. 7, 2017

(30) Foreign Application Priority Data

Dec. 16, 2014 (GB) .................................. 1422417.4

(51) Int. Cl.
*H01L 23/66* (2006.01)
*H01L 23/00* (2006.01)
(Continued)

(52) U.S. Cl.
CPC .............. *H01L 23/66* (2013.01); *H01L 24/94* (2013.01); *H01L 25/0657* (2013.01);
(Continued)

(58) Field of Classification Search
CPC . H01L 2224/29187; H01L 2224/29144; H01L 2224/83896; H01L 2223/6683;
(Continued)

(56) References Cited

U.S. PATENT DOCUMENTS 4,104,673 A * 8/1978 Dickens .............. H01L 29/8124
257/270
6,597,593 B1 * 7/2003 Cruz ........................ G06F 1/26
257/E27.046
(Continued)

FOREIGN PATENT DOCUMENTS

EP    2 242 103 A1    10/2010

OTHER PUBLICATIONS

International Search Report (PCT/ISA/210) dated Dec. 21, 2015, by the European Patent Office as the International Searching Authority for International Application No. PCT/EP2015/080002.
(Continued)

*Primary Examiner* — Caridad Everhart
(74) *Attorney, Agent, or Firm* — Buchanan Ingersoll & Rooney PC

(57) ABSTRACT

A technique for making high performance low noise amplifiers, low cost high performance RF, microwave circuits and other devices by using a minimum of costly high performance semiconductors is described. By combining a single discrete portion of an expensive semiconductor with a less expensive GaAs carrier, MMIC devices with improved performance over their discrete counterparts are achieved.

8 Claims, 1 Drawing Sheet

Figure 1:
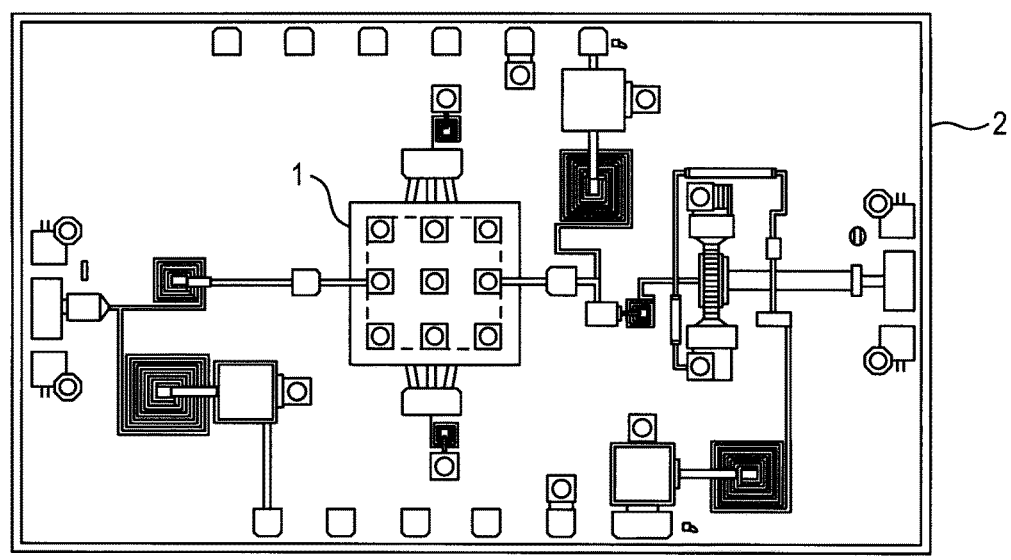

(51) Int. Cl.
*H01L 25/16* (2006.01)
*H01L 25/065* (2006.01)
*H01L 23/522* (2006.01)

(52) U.S. Cl.
CPC .......... *H01L 25/16* (2013.01); *H01L 23/5223* (2013.01); *H01L 23/5227* (2013.01); *H01L 23/5228* (2013.01); *H01L 2223/6644* (2013.01); *H01L 2223/6655* (2013.01); *H01L 2223/6683* (2013.01); *H01L 2224/29144* (2013.01); *H01L 2224/29187* (2013.01); *H01L 2224/48227* (2013.01); *H01L 2224/49113* (2013.01); *H01L 2224/83896* (2013.01); *H01L 2924/0002* (2013.01); *H01L 2924/14* (2013.01)

(58) Field of Classification Search
CPC ..... H01L 2223/6644; H01L 2223/6655; H01L 23/66; H01L 24/94; H01L 25/16; H01L 25/0657
See application file for complete search history.

(56) References Cited

U.S. PATENT DOCUMENTS

| | | | |
|---|---|---|---|
| 7,956,381 B1* | 6/2011 | Brewer | H01L 23/66 257/160 |
| 8,138,599 B2* | 3/2012 | Megahed | H01L 23/49838 257/723 |
| 8,349,650 B1 | 1/2013 | Brewer et al. | |
| 9,444,510 B2* | 9/2016 | Leong | H04B 15/04 |
| 2008/0067559 A1* | 3/2008 | Brar | H01L 27/0605 257/273 |
| 2009/0079065 A1 | 3/2009 | Furgut et al. | |
| 2010/0222013 A1* | 9/2010 | Megahed | H01L 23/49838 455/90.2 |
| 2010/0246153 A1* | 9/2010 | Buer | H01L 23/66 361/784 |
| 2012/0314371 A1 | 12/2012 | Mishra et al. | |
| 2014/0002188 A1* | 1/2014 | Chen | H03F 3/19 330/250 |
| 2015/0162318 A1* | 6/2015 | Allinger | H01L 22/26 257/48 |
| 2015/0244410 A1* | 8/2015 | Leong | H04B 1/00 455/73 |

OTHER PUBLICATIONS

Written Opinion (PCT/ISA/237) dated Dec. 21, 2015, by the European Patent Office as the International Searching Authority for International Application No. PCT/EP2015/080002.

R.H. Witvers et al., "MMIC GaAs and InP Very Low Noise Amplifier Designs for the Next Generation Radio Telescopes", 12th GAAS Symposium-Amsterdam, 2004, pp. 367-370.

Office Action dated Oct. 29, 2018, by the GB Patent Office in corresponding GB Patent Application No. 1422417.4. (6 pages).

* cited by examiner

INTEGRATED CIRCUITS AND METHODS OF MANUFACTURING

The invention relates to integrated circuits. More specifically but not exclusively it relates to semiconductor circuits comprising multiple modules that may include low noise amplifiers for microwave frequencies and methods of manufacturing the same.

Many applications utilising microwave frequencies, such as radio astronomy or radar, require very low noise amplifier modules (LNAs) for successful operation. These are currently designed with discrete transistors on ceramic substrates using what is termed "hybrid" technology. The discrete transistors used can be expensive, and there can be the need to use specialised low volume "esoteric" semiconductor technologies (for example 0.1 um gate InP FETs, 0.1 um mHEMT GaAs technology). These amplifiers built using discrete transistors and hybrid technology can be very costly to assemble and test.

Furthermore, it will be appreciated that this hybrid approach is best suited to systems using relatively low numbers of LNAs, for example "single pixel" radio astronomy receivers, where cost and/or space are not absolute drivers to the success of the system. However, many proposed new systems in radio astronomy, radar and telecommunications are based on 'active array' concepts with large number of elements per system. For example, a 'Square Kilometer Array' Radio Telescope deploys either a Medium Frequency Active Array (MFAA), where 100,000's to millions of elements are arrayed over a large area or a Medium Frequency Dish Array (MFDA) using thousands of dishes which may, if cost and performance effective, use a Phased Array Feed (PAF) Receiver to create a "multiple pixel" view of the sky and hence improve sky survey time.

Additionally in AESA radar systems there are thousands of modules and hence LNAs per system. Similarly, in Naval/ground based/missile defence radar there are thousands to tens of thousands of modules per system.

Large volumes of electronic components are more readily implemented as integrated circuits in III/V semiconductor such as GaAs or InP, MMICs or Silicon CMOS/SiGe RFICs.

"MMIC GaAs and InP Very Low Noise Amplifier Designs for Next Generation Radio Telescopes"; R Witver, J Bij de Vaarte, A Sarmasanu; 12th GaAs Symposium, European Microwave Week, Amsterdam 2004, pp 307-70, describes Low Noise Amplifier designs currently envisaged for next generation systems such as those described above.

Amplifier modules manufactured from GaAs and InP are best for "microwave" applications (ie >1 GHz) and, for very low noise, the gate size (but more particularly length) needs to be very small. The substrate material and/or manufacturing process can be very esoteric in the case of 0.1 um gate InP, or low volume in the case of 0.07 um GaAs mHEMT so these devices tend to be manufactured by small "boutique" fabrication facilities and are hence expensive and not commonly supplied.

Accordingly, MMICs made in these processes are usually very expensive.

Semiconductor modules or components made via lower cost GaAs processes, for example optical gates ≥0.25 um fabricated on large volume 6" wafers, for example WIN 25-20 pHEMT, RFMD FD30 pHEMT, TriQuint TQP 25, are 2 orders of magnitude or more cheaper but cannot achieve the very low noise figures required for radio astronomy and many other applications.

RFICs and MMICs integrate all components in one die, for example semiconductor devices (FETs, Shottky diodes, varactors) and passive "lumped element" devices such as resistors, capacitors, and inductors all connected via transmission lines such as microstrip and coplanar lines.

The main advantages of RFICs and MMICs are that they allow system size, weight and power consumption reduction over discrete circuits, they are very low cost in high volume, especially in the case of silicon RFICs, and they provide repeatable unit to unit performance. Additionally, they are all made on the same wafer with repeatable batch-batch processing. Furthermore, reliability is improved due to integration as in most discrete circuits it is the solder joints and connection that are unreliable. Often there is improved performance for an integrated circuit compared with its discrete counterpart as there is no parasitic wiring inductance or capacitance.

Gallium arsenide is a desirable substrate for an IC as it is a semi-insulating substrate (even after processing) that provides better performance in passive components such as resistors, capacitors, and inductors that can be less lossy. Furthermore GaAs is a higher electron mobility material (in that it exhibits more gain at higher frequencies), and provides higher performing transistors for given gate finger length.

Accordingly, it is a requirement for at least the modern technologies described above to adopt an RFIC or MMIC to replace current LNAs or other discrete circuits currently in use.

Furthermore, there is a need for a solution combining performance of 0.1 um InP FET with low cost of 6" GaAs.

The invention aims to overcome these and other problems with existing systems.

According to the invention there is provided an integrated circuit module comprising a first portion and a second portion, the first portion comprising at least one first discrete component, the second portion comprising a carrier integrated circuit, in which the first portion is mounted on the second portion.

According to the invention there is further provided a method of manufacturing an integrated circuit module comprising the steps of manufacturing a first portion of the semiconductor circuit, manufacturing a second portion of the semiconductor circuit comprising a carrier integrated circuit; and mounting the first portion on the second portion.

One aspect of the invention can be summarised as a technique for making high performance low noise amplifiers by using a minimum of costly high performance semiconductors, for example InP single FET added to a substrate comprising a GaAs MMIC made on a high volume low cost process.

By the combination of a single transistor (low area) of expensive semiconductor with a cheap GaAs MMIC, an LNA in accordance with the invention promises to give the high performance of InP with the cost advantage of a low cost low performance 6" high volume GaAs MMIC.

Figure 2:
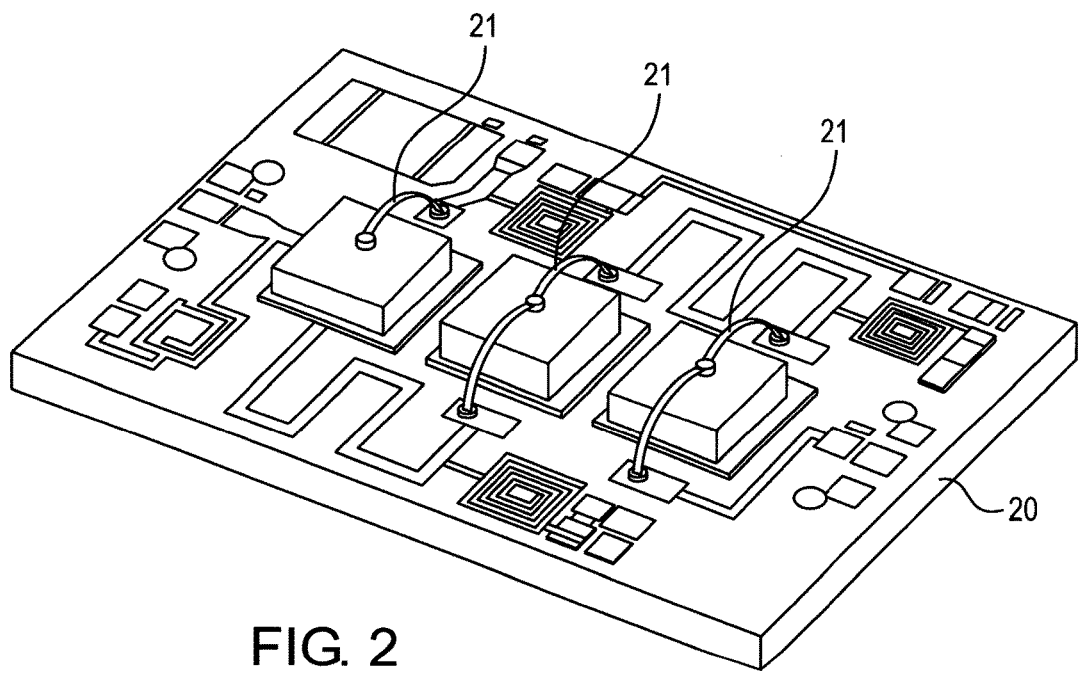

The invention will now be described with reference to the accompanying diagrammatic drawings in which:

FIG. 1 is a schematic diagram of a composite very low noise discrete (small size) FET mounted on a low cost GaAs carrier chip; and FIG. 2 is a schematic diagram of an LNA/PIN diode based high power RF switch/microwave limiter protection circuit as a first portion mounted on a GaAs carrier circuit second portion.

As can be seen in FIG. 1, a discrete FET 1 is mounted on a larger carrier chip 2. The FET 1 may be a 0.1 um InP/GaAs FET and the carrier chip may be a 0.3 um GaAs low cost carrier chip. It will, however, be appreciated that any other suitable alternatives are envisaged. The carrier chip 2 provides match and bias circuitry and less critical 2nd stage amplification, and may include other components such as further FETs, plus passive components such as resistors, inductors and capacitors.

The FET 1 is manufactured from GaAs or InP and, in order to achieve low noise, the gate size needs to be very small which is achievable using these materials and high cost fabrication techniques. The substrate material and/or manufacturing process for this part of the module may be very complex in order to achieve the required circuit characteristics as, for example, in the case of 0.1 um gate InP, or low volume in the case of 0.07 um GaAs mHEMT.

The GaAs carrier chip 2 may be manufactured via lower cost or simpler GaAs processes, for example, and optical gates ≥0.25 um may be fabricated on large volume 6" wafers, for example WIN 25-20 pHEMT, RFMD FD30 pHEMT, TriQuint TQP 25.

For example only a simplified description of the manufacture of a GaAs MESFET is outlined below. It will be appreciated that this is for example only and should not be considered as the only method of manufacture.

Firstly an active layer is grown on a semi insulating wafer, the active layer being a Si doped conductive layer grown on an insulating substrate. Next an isolated mesa is formed for the active devices and ohmic contacts are added, for example FET source and drain and diode contacts. Next the gate channel is etched and the gate metal deposited then the metal bottom layer interconnect that forms, for example capacitor bottom plates and inductors. Then dielectric deposition is performed, for example using silicon nitride insulation, then a further metal layer is deposited that will form for example capacitor top plates and further inductors. Then die passivation in silicon nitride occurs and finally back face processing is undertaken including wafer thinning and adding vias by etching through the substrate.

The invention will now be described in relation to a second specific embodiment as shown in FIG. 2.

In this second embodiment of the invention an expensive existing ceramic hybrid module in an ESCAN radar was replaced with lower cost components whilst keeping to, or reducing, a predetermined module footprint. In this embodiment, reducing the footprint was key to achieving a reduced antenna element spacing required for wideband, high frequency operation.

The module includes a combined microwave limiter, low noise amplifier (LNA) and high power RF switch in a low cost package. In the present embodiment a 3-D microwave assembly married to GaAs technology and custom low cost packaging was utilised.

As shown in FIG. 2, a custom GaAs MMIC LNA is co-designed with a PIN diode based high power RF switch and microwave limiter protection circuit. Normally the RF switch and limiter would be realised on a ceramic substrate with discrete transmission lines, resistors, decoupling capacitors and bias circuits. However, in the present embodiment, the passive components including resistors, capacitors, and inductors for bias circuits are implemented directly on a GaAs carrier chip 20. The separately formed silicon limiter and switch PIN diodes are mounted conductively on and bonded to the GaAs IC 20 by gold wires 21.

The limiter/LNA/switch assembly may then be mounted in low cost LCP packaging with other GaAs ICs (HPA/LNA) with 50% of the PCB footprint and ~30% of the cost of a conventional implementation.

Although a novel technology solution, the embodiment described above has been shown to generate significant a cost reductions in radar applications. For EW Array applications the approach also demonstrates size, weight power and cost advantages.

Advantageously, the semiconductor modules described above such as the LNA or "Front-end" circuit for an ESCAN radar system described above and the method of their manufacture make them compatible with low cost packaging schemes such as plastic or ceramic Quad Flatpack No-leads (QFN)—a style of plastic (or lower cost ceramic) packaging.

In this way, a semiconductor module may be produced that is low cost and of small size but has operating performance of the high cost custom manufactured semiconductor modules currently available.

It will be appreciated that the invention is not limited to the two embodiments described above. Any part of a semiconductor module, such as GaAs FETs, Si diodes (PIN, varactor, schottky etc), GaN FETs Silicon bipolar transistors that cannot be incorporated into a "carrier" MMIC, or where doing so would be expensive, can be "piggy backed" on top of the carrier chip if circuit performance advantage (and cost advantage) can be obtained by the combining of the two or more different elements.

Furthermore, the invention is not limited to limiters. Indium phosphide and GaAs mHEMT technology with 0.1 um gate geometry make superb low noise amplifiers with unbeatable noise figures currently but are very expensive processes to make in integrated circuits, while 0.3 um pHEMT is a low cost GaAs process made in high volume (6" wafers) but having poorer noise figure. It is envisaged that the above technique would allow combination of the two in the form of a low noise InP or GaAs mHEMT discrete transistor for the amplifier 1st stage 'piggy backed' on a 0.3 um GaAs pHEMT carrier MMIC.

It will be appreciated that there are many further applications that the present invention anticipates and the embodiments only provide examples of a technique with wider applications.

The invention claimed is:

1. An integrated circuit module having a discrete semiconductor component providing a first portion of a semiconductor circuit, the discrete semiconductor component being mounted on a carrier integrated circuit chip that provides a second portion of the semiconductor circuit, wherein the first portion of the semiconductor circuit comprises discrete PIN diodes, and the second portion of the semiconductor circuit comprises a GaAs carrier chip having RF switching means.

2. An integrated circuit module according to claim 1, in which:
the first portion of the semiconductor circuit comprises an FET having a first smaller gate size suitable for low noise amplification, and the second portion of the semiconductor circuit comprises a GaAs MMIC carrier chip having optical gates of a second larger gate size.

3. An integrated circuit module according to claim 1, in which:
the first portion comprises:
an InP or GaAs substrate, and
the second portion comprises:
a GaAs MMIC.

4. An integrated circuit module according to claim 1, wherein the first portion of the semiconductor circuit provides a first amplifier, and the second portion of the semiconductor circuit provides a second amplifier,
wherein the first amplifier has a small gate size.

5. An integrated circuit module according to claim 4, in which:

the first portion comprises:
an FET having a first smaller size suitable for low noise amplification, and
the second portion comprises:
a GaAs MMIC carrier chip having optical gates of a second larger gate size.

6. A method of manufacturing an integrated circuit module, comprising:
(a) manufacturing a first portion of a semiconductor circuit of the integrated circuit, the first portion having a discrete semiconductor component;
(b) manufacturing a second portion of the semiconductor circuit having a carrier integrated circuit, wherein the second portion includes a carrier chip having a second stage amplifier; and
(c) mounting the first portion on the second portion,
wherein the manufacturing step (a) comprises:
manufacturing at least one PIN diode, and
the manufacturing step (b) comprises:
manufacturing a carrier chip having a GaAs FET incorporated into a carrier MMIC.

7. A method according to claim 6, in which:
the manufacturing step (a) comprises:
manufacturing the amplifier with a first smaller gate size, and
the manufacturing step (b) comprises:
manufacturing a carrier chip having the second stage amplifier with a second gate size larger than that in the first portion.

8. A method according to claim 6, in which:
the first portion comprises:
an InP or GaAs substrate, and
the second portion comprises:
a GaAs MMIC.

\* \* \* \* \*